(12) United States Patent
Landis

(10) Patent No.: US 7,148,417 B1
(45) Date of Patent: Dec. 12, 2006

(54) GAP/SILICON TANDEM SOLAR CELL WITH EXTENDED TEMPERATURE RANGE

(75) Inventor: Geoffrey A. Landis, Berea, OH (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 650 days.

(21) Appl. No.: 10/403,714

(22) Filed: Mar. 31, 2003

(51) Int. Cl.
*H01L 31/0304* (2006.01)

(52) U.S. Cl. .................... 136/262; 136/261

(58) Field of Classification Search ............. 136/262, 136/261
See application file for complete search history.

(56) References Cited

U.S. PATENT DOCUMENTS

| | | | |
|---|---|---|---|
| 4,255,211 A | 3/1981 | Fraas | |
| 4,272,641 A | 6/1981 | Hanak | |
| 4,295,002 A | 10/1981 | Chappell et al. | |
| 4,332,974 A | 6/1982 | Fraas | |
| 4,582,952 A * | 4/1986 | McNeely et al. | 136/249 |
| 4,658,086 A | 4/1987 | McLeod et al. | |
| 4,771,321 A | 9/1988 | Lewis | |
| 5,853,497 A | 12/1998 | Lillington et al. | |
| 5,911,839 A | 6/1999 | Tsai et al. | |
| 5,944,913 A | 8/1999 | Hou et al. | |
| 6,281,426 B1 * | 8/2001 | Olson et al. | 136/249 |
| 6,300,558 B1 | 10/2001 | Takamoto et al. | |
| 6,340,788 B1 * | 1/2002 | King et al. | 136/261 |
| 6,372,980 B1 | 4/2002 | Freundlich | |
| 6,504,091 B1 | 1/2003 | Hisamatsu et al. | |
| 6,507,041 B1 | 1/2003 | Nakamura et al. | |

\* cited by examiner

*Primary Examiner*—Nam Nguyen
*Assistant Examiner*—Anthony Fick
(74) *Attorney, Agent, or Firm*—Howard M. Cohn; Kent N. Stone

(57) ABSTRACT

A two-junction solar cell has a bottom solar cell junction of crystalline silicon, and a top solar cell junction of gallium phosphide. A three (or more) junction solar cell has bottom solar cell junctions of silicon, and a top solar cell junction of gallium phosphide. The resulting solar cells exhibit improved extended temperature operation.

34 Claims, 2 Drawing Sheets

GAP/SILICON TANDEM SOLAR CELL WITH EXTENDED TEMPERATURE RANGE

ORIGIN OF THE INVENTION

The invention described herein was made by an employee of the United States Government and may be manufactured and used by or for the Government for Government purposes without the payment of any royalties thereon or therefor.

TECHNICAL FIELD OF THE INVENTION

The invention relates to photovoltaic (PV) cells (also known as "solar cells") and, more particularly, to tandem (e.g., dual junction, triple junction) solar cells.

BACKGROUND OF THE INVENTION

It was discovered in the 1830s that exposing an electrolytic cell to light increased the amount of current it generated. But the first commercial photovoltaic (PV) products arrived only in the 1950s, when silicon PV devices produced electricity with an efficiency of 4.5 percent. By 1960, the efficiencies of research devices reached 14 percent and commercial products 10 percent.

The simplest PV cell starts out as a wafer of crystal silicon, in which each atom forms covalent bonds with four adjacent atoms in a highly ordered lattice. A potential is obtained by doping the silicon with boron and phosphorus. When boron, with three valence electrons, bonds at a site normally occupied by a silicon atom, with four, one bond must accept an electron from the crystal lattice. Left behind is a positively charged mobile carrier (or hole) that with its fellows forms p-type material. Phosphorus, with five valence electrons, donates an electron to the lattice to create n-type material. The ionized impurity is fixed in the silicon crystal lattice, which contains a balancing number of mobile electric charge-carriers of opposite charge. Boron normally is contained in the wafers used for PV cells in minute, part-per-million concentrations. As for the phosphorous, a high-temperature process diffuses it into the wafer surface in slightly greater concentration than the boron background. Other dopant atoms which produce a p-type material in silicon are the elements of group III of the periodic table, such as aluminum, gallium and indium. Other dopant atoms which produce a n-type material in silicon are the elements of group IV of the periodic table, such as arsenic and antimony.

The junction between n-type and p-type material is referred to as a p-n junction. This junction drives all the mobile charge from the region, leaving a built-in potential sustained by the fixed ionized acceptors and donors. When the silicon absorbs a photon, the event frees an electron to become a mobile carrier and simultaneously creates a hole. The p-n junction, with its built-in electric field, can separate the electron and hole, and the current thus generated can flow when the device is connected to an external circuit. Device efficiency is defined as the ratio of the electric power produced to the power of the incident light, or photons.

Today, the efficiency of cells made in polycrystalline wafers is nearly as good as for single-crystal types. Even greater reductions in materials cost can be achieved if the promise of thin-film technologies is realized. Standard silicon wafers are 200–500 μm thick, but with recently improved optical designs only 10 μm of silicon could be sufficient to capture all the available light. Other materials, such as amorphous silicon or copper indium diselenide (CIS), have an inherently higher absorption coefficient that can shrink the required thickness to 1 μm or less, but at present are only a small portion of the market for solar cells.

The bulk of the PV business builds on the traditional silicon solar cell. Silicon ingots are formed by single-crystal growth on a seed pulled from the silicon melt (a process accounting for 40 percent of sales at present) or by casting large polycrystalline blocks (44 percent of sales). Wafers are sliced from the ingots and turned into full-wafer diodes by high-temperature diffusion processes that minutely modify the surface-layer chemical composition to form a p-n junction. The PV devices are typically completed with electrical contacts and anti-reflection coatings.

Solar cells comprising III–V semiconductors such as gallium arsenide, gallium aluminum arsenide and gallium indium arsenide phosphide (GaAs, GaAlAs, and GaInAsP) have been combined in multiple junctions to reach high efficiencies.

Bandgap Energy (Eg)

Semiconductor materials used for solar cells have a characteristic energy bandgap Eg. This bandgap is characteristic of the material. Bandgap is measured in units of electron volts (eV). Some typical bandgaps are 0.67 eV for germanium, 1.1 eV for silicon, and 1.4 eV for gallium-arsenide. Lower bandgap materials absorb a wider range of light. The cut-off wavelength is the longest wavelength of light that can be usefully absorbed by a semiconductor. This cutoff wavelength is related to the bandgap Eg of the semiconductor by the relation $$\lambda_c = \frac{hc}{Eg}$$

where h is Planck's constant, and c is the speed of light.

Thus, the lower the bandgap of the semiconductor, the more light can (in principle) be usefully absorbed, and the higher the photocurrent of a solar cell made from that semiconductor.

The voltage produced by a solar cell increases as the bandgap increases. Since the power produced is proportional to the product of the voltage and the photocurrent, there exists an optimum bandgap for a single junction solar cell. For a solar cell operation at an operating temperature of about 25 degrees Celsius, this optimum bandgap is near 1.5 eV.

Multiple Junction Solar Cells

The highest efficiency solar cells manufactured today use the technique of multiple junctions with "subcells" of different bandgaps of semiconductor material. Each subcell is a layer of a semiconductor with a p-n collection junction. The layers are placed on top of each other. This technique splits the solar spectrum into several bands, each one absorbed by a semiconductor layer which is chosen to most efficiently use the spectral range. The topmost layer is the highest bandgap, and absorbs the shortest wavelength light. The next layer down is the next highest bandgap, and absorbs slightly longer wavelength light, and so downward until the lowest layer is the lowest bandgap material, absorbing the longest wavelength light. For example, commercial "triple junction" solar cells use a top layer of gallium indium phosphide semiconductor, a second layer of gallium arsenide semiconductor, and a bottom layer of germanium semiconductor. The materials are chosen to have the same crystalline lattice constant so that the layers can be deposited by the technique of epitaxy, well known in the art to produce layers with a low level of crystalline flaws and defects. It is possible to make layers from semiconductors which are not precisely matched in lattice constant, but in general this technique produces a lower quality material, and only lattice-matched (or nearly lattice-matched) materials are currently used in state-of-the-art high efficiency solar cells.

Solar cells with multiple junctions connected in series with one another are sometimes referred to in the literature as "tandem" solar cells, or "cascade" solar cells. Cells with two junctions are referred to as "dual" junction solar cells, and cells with three junctions as "triple" junction solar cells.

The subcells are typically connected to one another by a semiconductor tunnel junction which serves to connect the subcells electrically, in series with one another. (When the number of junctions is counted, the tunnel junction layers are conventionally omitted. For example, a "dual" junction solar cell has a top p-n junction (or subcell), a bottom p-n junction (or subcell), plus a tunnel junction connecting the two subcells.

Layers connected electrically in series are constrained to have the same current flowing through each layer. For a multiple junction solar cell to work efficiently, the bandgaps of the semiconductor layers must be carefully chosen so that the photocurrent produced by each layer is the same. Either the bandgap of the material or the thickness of the layer (or both) is adjusted to make this match in current.

The epitaxy process grows semiconductor layers on a substrate wafer, usually a single-crystal semiconductor, which provides mechanical support. The highest efficiency solar cells commercially manufactured today use germanium substrate wafers. This material is lattice matched to the wider bandgap semiconductors gallium arsenide and gallium-indium phosphide, producing a three-junction solar cell.

High Temperature Operation

One difficulty of solar cells for some applications is that they do not operate efficiently at elevated temperatures. For example, a typical gallium arsenide solar cell loses approximately 0.2% of its initial power for each rise of one degree Celsius (C) in operating temperature. At an operating temperature of 450 C, the power output is reduced to only 20% of the output at 25 C. A typical silicon solar cell has even worse temperature performance, losing about 0.45% of its initial power for each degree of increase in operating temperature. Above about 250 C, silicon solar cells produce essentially zero power.

The amount of power decrease with temperature depends on the bandgap of the semiconductor material which the solar cell is made from, and the higher the bandgap, the lower the power lost at elevated temperature.

The photocurrent has very little dependence on temperature (in fact, a slight increase with rising temperature). The decrease in performance is primarily due to a decrease in voltage at the operating point.

U.S. Pat. No. 4,582,952 discloses Gallium Arsenide Phosphide Top Solar Cell. A tandem solar cell includes a gallium arsenide phosphide top solar cell and silicon bottom solar cell. The gallium arsenide phosphide solar cell is fabricated on a transparent gallium phosphide substrate and either placed in series with the silicon solar cell for a two terminal device or wired separately for a four terminal device. The top solar cell should have an energy gap between 1.77 and 2.09 eV for optimum energy conversion efficiency. A compositionally graded transition layer between the gallium phosphide substrate and the active semiconductor layers reduces dislocations in the active region. A gallium phosphide cap layer over the gallium arsenide phosphide solar cell reduces surface recombination losses. A difficulty with this design is that Gallium Arsenide Phosphide of energy gap 1.77 to 2.09 eV is not lattice-matched to the silicon crystal, which makes growth of high quality material difficult.

U.S. Pat. No. 4,295,002 discloses heterojunction V-groove multijunction solar cell. In this solar cell, the semiconductor body 13 is either undoped or lightly doped with conductivity type determining impurities. An etching mask, such as an oxide layer 22, which initially provided for the dimension control of the etching of the body 13 from the starting silicon wafer, covers the top of the body 13. The sides 15 and 17 of body 13 are undercut. Illustratively, a region of n-conductivity type gallium phosphide 14 is provided along side 15. Similarly, a region of p-conductivity type gallium phosphide 16 is provided along side 17. The GaP regions 14 and 16 may be formed by angled molecular beam epitaxial deposition. A discontinuous metal layer, e.g., of aluminum, is then provided by vacuum deposition. The metal layer is in three parts 18, 20, 24 due to the undercut of oxide layer 22. It provides electrical contact between the n-type and p-type gallium phosphide regions on adjacent silicon bodies. In addition, the discontinuous metal layer provides an optically reflecting cover for the sunlight being converted in the body 13.

Terminology

A semiconductor junction commonly consists of two layers of semiconductor of opposite conductivity type. The two semiconductor conductivity types are p type, in which the majority conductor is a hole (of positive charge), and n type, in which the majority conductivity type is an electron (of negative charge). P-type and N-type are thus opposite conductivity types. The conductivity type is determined by a small amount of an element that produces free electron or holes in the semiconductor crystalline lattice; this is known as the "dopant", and the semiconductor with the dopant in the lattice is referred to as "doped". The junction between the semiconductors is a p-n junction. In a solar cell, a p-n junction collects and rectifies photocurrent produced by sunlight.

A p-n junction can be either a homojunction, in which the two layers are both made from the same semiconductor material (for example, both made from silicon), or a heterojunction, in which the two layers are made from different semiconductor materials (for example, a p-type silicon layer and a n-type gallium-phosphide layer).

Another type of junction is called a tunnel junction. A tunnel junction is a p-n junction with a high amount of doping. The high amount of doping allows current flow in the direction opposite to the normal p-n junction current flow.

A multiple junction solar cell consists of a number of individual subcells, each with a p-n junction, connected electrically in series with one another.

In a solar cell with multiple junctions, in order for voltages to add, the different junction layers need to have the same polarity; that is, if the top layer has p on the top (sun-facing) side and n on the bottom, the lower layer will also have p on the top and n on the bottom. Both p-on-n and also n-on-p solar cells can be fabricated. In order to connect each layer with the next layer, a tunnel junction is used. The tunnel junctions will have the opposite polarity, that is, if the top cell has a p-on-n structure, the tunnel junction connecting it to the next cell will have a n-on-p structure. This technique is well known in the art, and is used for highly efficient solar cells in commercial production.

An alternate technique for connecting layers of a multi-junction cell is to use ohmic metal interconnections between the layers. The metal is suitably gridded or spotted (patterned) to allow light to penetrate to the front surface of the solar cell. This is well known in the art.

Solar cells also have ohmic contacts to allow electrical connection to the cell, consisting of metal. The metal on the top (sun facing) surface is normally a partially transparent or gridded contact, in order to allow sunlight to reach the cell. The contact on the back side can be either gridded or continuous. Ohmic contacts may consist of several layers of metal. Again, ohmic contacts to solar cells are well known in the art, and are used in all conventional solar cells.

It is known to dispose a "window layer" on the sun-facing surface of a solar cell. The window layer is a layer of wide-bandgap semiconductor material of the same doping type as the material beneath it, so that a p-n junction is not formed. The purpose of the window layer is to reduce the loss of photo-generated carriers at the surface of the active layer of the semiconductor. For example, a typical gallium-arsenide solar cell uses an aluminum arsenide or aluminum-gallium-arsenide window layer on the front surface. A window layer is not usually considered an active semiconductor layer, since the primary purpose of the window layer is not to generate carriers.

BRIEF DESCRIPTION (SUMMARY) OF THE INVENTION

It is a general object of the invention to provide an improved solar cell.

It is an object of the invention to provide a solar cell with improved performance at elevated temperatures.

It is an object of the invention to provide a multiple junction solar cell utilizing silicon in the bottom junction.

It is an object of the invention to provide a solar cell which has good performance both at temperatures around room temperature, and also at high operating temperature. Such a solar cell could be used in both high-temperature environments and also in terrestrial operating environments.

It is an object of the invention to provide a solar cell which can be manufactured on crystalline silicon (Si) substrates, because silicon is lower in weight, has greater resistance to fracture, and has higher thermal conductivity than the germanium substrates currently being used for multi-junction cells. It is also lower in cost, and is grown in larger area wafers.

According to the invention, a two-junction solar cell comprises a bottom solar cell junction of crystalline silicon, and a top solar cell junction of gallium phosphide.

According to an embodiment of the invention, a three (or more) junction solar cell comprises bottom solar cell junctions of silicon, and a top solar cell junction of gallium phosphide. Generally, a single-layer wide-bandgap solar cell junction is electrically connected in series on top of at least two series-connected lower junctions of substantially the same bandgap as one another.

The resulting solar cells exhibit improved extended temperature operation.

Other objects, features and advantages of the invention will become apparent in light of the following description thereof.

BRIEF DESCRIPTION OF THE DRAWINGS

Reference will be made in detail to preferred embodiments of the invention, examples of which may be illustrated in the accompanying drawing figures. The figures are intended to be illustrative, not limiting. Although the invention is generally described in the context of these preferred embodiments, it should be understood that it is not intended to limit the spirit and scope of the invention to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity.

Figure 1:
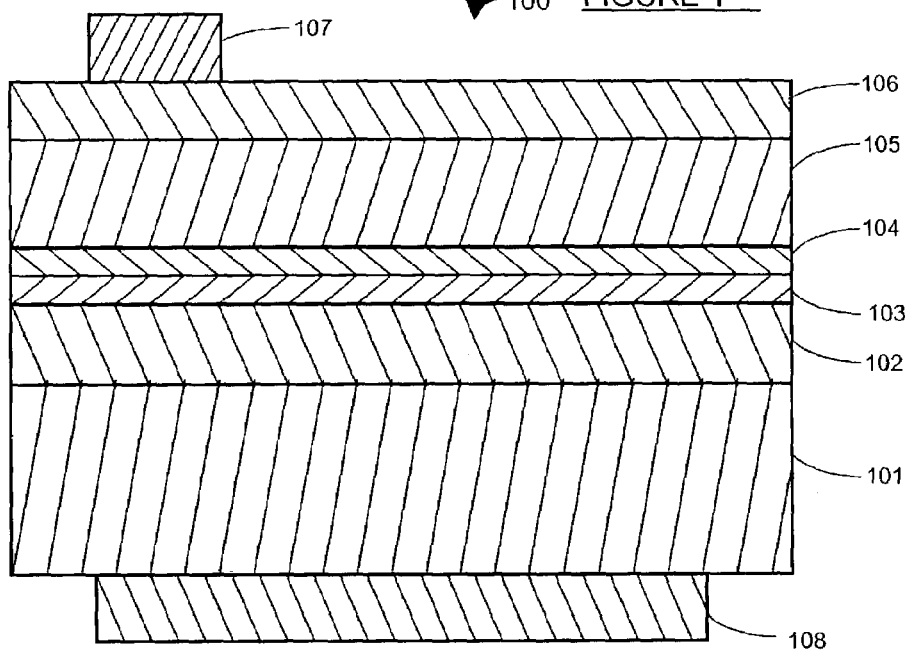
Figure 2:
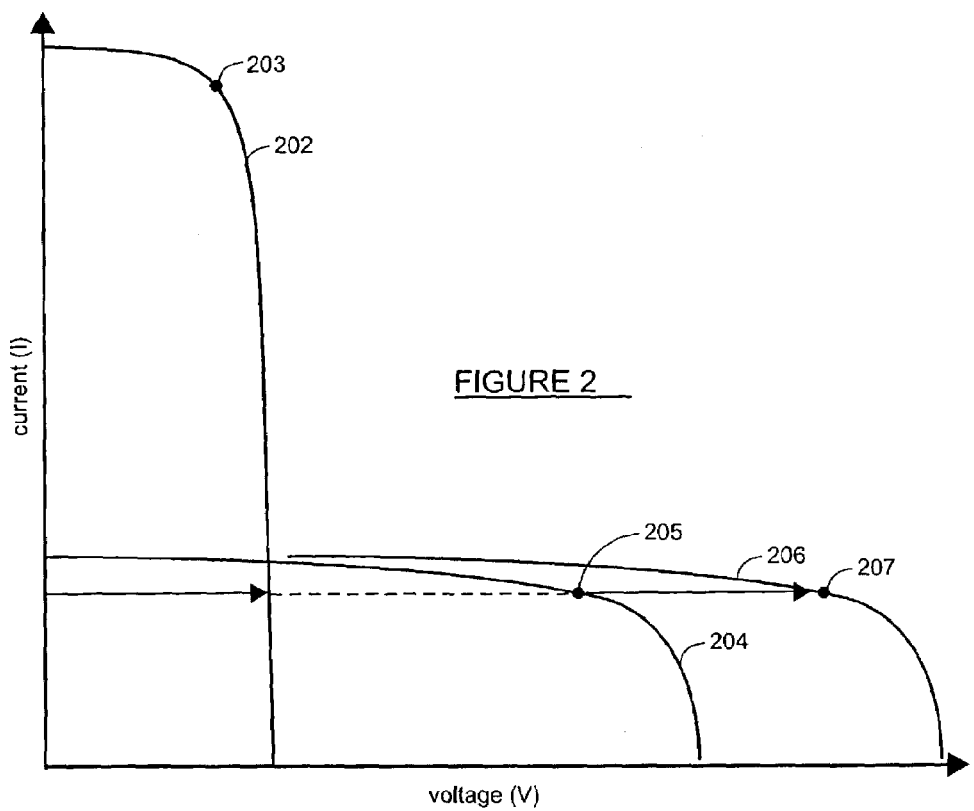

Elements of the figures are typically numbered as follows. The most significant digits (hundreds) of the reference number correspond to the figure number. For example, elements of FIG. 1 are typically numbered in the range of 100–199, and elements of FIG. 2 are typically numbered in the range of 200–299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199a, 199b, 199c, etc. Such relationships, if any, between similar elements in the same or different figures will become apparent throughout the specification, including, if applicable, in the claims and abstract.

Figure 3:
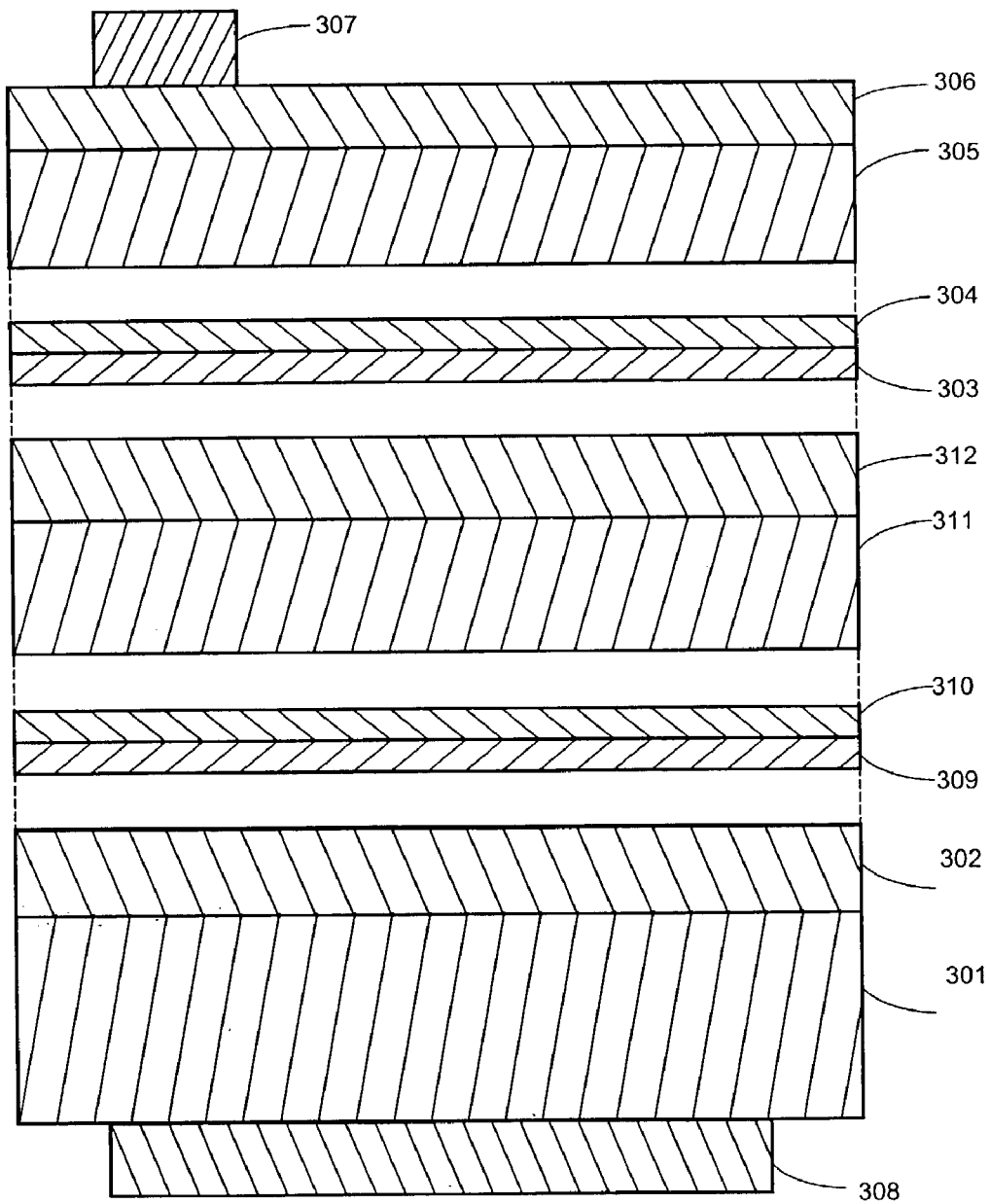

The structure, operation, and advantages of the present preferred embodiment of the invention will become further apparent upon consideration of the following description taken in conjunction with the accompanying figures, wherein:

FIG. 1 is a schematic cross section of an embodiment of a solar cell, according to the invention;

FIG. 2 is a graph (plot) of current (I) and voltage (v) for the embodiment of a solar cell shown in FIG. 1; and FIG. 3 is a schematic, exploded, cross-sectional view of an alternate embodiment of a solar cell, according to the invention.

DETAILED DESCRIPTION OF THE INVENTION

FIG. 1 illustrates a two-junction, tandem solar cell 100, according to an embodiment of the invention.

Generally, the solar cell 100 comprises a first subcell of crystalline silicon and a second subcell of gallium phosphide, connected with a tunnel junction. Each subcell comprises a junction between two opposite conductivity types—"p" type and "n" type.

The first subcell comprises:

a substrate layer 101 of crystalline silicon of a first semiconductor conductivity type (either p-type or n-type), a layer 102 of silicon of second semiconductor conductivity type (either n-type or p-type), opposite to the first semiconductor conductivity type, with the interface between the two conductivity types composing a p-n semiconductor junction;

The substrate layer 101 is suitably a silicon wafer. If the semiconductor wafer has polarity "p", the overlying layer 102 has polarity "n". Conversely, if the semiconductor wafer has polarity "n", the overlying layer 102 has polarity "p". In either case, a photovoltaic p-n semiconductor junction is formed.

It should be understood that the substrate layer 101 may be a layer on another substrate (not shown). The preferred material for the substrate layer 101 is single crystal silicon. The materials of the overlying layer 102 (and subsequent layers) should be lattice matched to the substrate layer 101.

The second subcell comprises:
a layer 105 of gallium phosphide of the first conductivity type,
a surface layer 106 of gallium phosphide of the second conductivity type, If the first gallium phosphide layer 105 has polarity "p", the overlying gallium phosphide layer 106 has polarity "n". Conversely, if the first gallium phosphide layer 105 has polarity "n", the overlying gallium phosphide layer 106 has polarity "p".

Gallium phosphide may be doped with zinc atoms to produce a p-type material, and with sulfur to produce an n-type material. Gallium phosphide is commonly doped with zinc atoms to produce a p-type material, and with sulfur to produce a n-type material. More generally, n-type doping is produced by introducing a group-II atom on the gallium site of the lattice, or a group-IV atom on the phosphorus site. Correspondingly, n-type doping is produced by introducing a group-VI atom on the phosphorus site, or a group-IV atom on the gallium site.

The solar cell 100 further comprises: a tunnel-junction comprising two layers 103 and 104 disposed atop the layer 102, between the silicon subcell and the GaP subcell. The tunnel junction connects the top layer 102 of silicon to the bottom layer 105 of gallium phosphide. The tunnel junction can be either in the silicon layer, in the gallium phosphide layer, or between the two layers, such that the p-type material is GaP and the n-type material is Si.

An alternate technique for connecting the silicon subcell and the GaP subcell with a tunnel junction is to use ohmic metal interconnections between the layers. In this method of connection, a gridded or spotted metal layer is disposed between the silicon subcell and the GaP subcell. The gridded or spotted nature of the metal layer allows light to penetrate through the metal layer to the cell below. For example, a gridded metal layer might comprise a plurality of one micrometer stripes of metal, of thickness 0.05 micrometers, with spacing of 100 micrometers, thus allowing 99% transmission of the light.

Regarding the layers 101 and 102 of the first subcell, and 105 and 106 of the second subcell, it should be understood that the second layer (102, 106) can be an oppositely doped region within the first layer (101, 105). Then, the p-n (or n-p) junction is physically within a layer, rather than being two distinct physical layers, one atop the other. Similarly, the second layer 104 of the tunnel-junction may comprise an oppositely doped region within the first layer 103 of the tunnel junction. The same applied to other pairs of "layers" forming junctions, as described hereinbelow. However, for illustrative clarity, each junction is described as being two layers.

In a tandem solar cell with multiple junctions, the different subcells will normally have the same polarity; that is, if the top subcells has p on the top (sun-facing) side and n on the bottom, the lower subcells will also have p on the top and n on the bottom, so that the voltages generated by the series connection of subcells will be additive. Both p-on-n and also n-on-p solar cells can be fabricated. Each solar cell junction (subcell) is basically a diode, and the two diodes should be connected in series, in the same direction, so that the voltages that they develop are additive. The same current will (by definition) flow through both solar cell junctions. In order to connect each layer with the next layer, a tunnel junction is often used. The tunnel junction will have the opposite polarity, that is, if the top cell has a p-on-n structure, the tunnel junction connecting it to the next cell will have a n-on-p structure. This technique is well known in the art, and is used for highly efficient solar cells in commercial production. Orienting the subcells with opposite polarity is of course possible, but the voltages generated thereby would be subtractive.

At least one top (front) metal contact 107 is disposed atop, and electrically connected to, the top (front) GaP layer 107. At least one bottom (back, rear) metal contact 108 is disposed beneath, and electrically connected to, the bottom silicon layer 101. A window layer (not shown) may be disposed atop the GaP layer 106. The solar cell is illuminated from the top/front side.

The solar cell 100 can be manufactured in either a p-on-n configuration, with the top layers being p-type semiconductor, or in a n-on-p configuration. The composition of the top semiconductor layers can be varied by the substitution of no more than ten percent of one of the group III elements (boron, aluminum, indium, or thallium) for the gallium, or a substitution of no more than ten percent one of the group V elements (nitrogen, arsenic, antimony, or bismuth) for the phosphorus in the compound.

The p-n junction in the silicon (101, 102) can be disposed close to the top of the wafer 101, near to the GaP layer 105, or it can be disposed close to the bottom (back) of the wafer 101, close to the back metal contact 108.

In any semiconductor, the shortest wavelength light is strongly absorbed, and hence creates photogenerated carriers near the front of the cell. Longer wavelength light is less strongly absorbed, and generates carriers deeper within the cell. In most conventional single-junction solar cells, the p-n junction is located close to the front, in order to efficiently collect the carriers generated by the short wavelength light. For the multijunction cell disclosed herein, however, for the silicon subcell, the short wavelength light is filtered out by the GaP top layer. Thus, for the silicon subcell, there is no significant performance advantage to placing the p-n junction close to the front of the silicon and, in fact, performance may even be gained by placing it deep within the cell. In the case of the bottom subcell in a device with two or more silicon subcells beneath a GaP layer, the short wavelength light will be filtered out by both the GaP layer and also by the other silicon layers, and hence for the bottom subcell a deep location for the p-n junction, possibly even a junction located near the back of the cell, could be desirable in terms of performance.

However, performance is only one consideration in design of a cell. Because processing technology often uses techniques of diffusion, a technique which most easily creates junctions near the front surface, and epitaxial growth, a technique in which the cost is directly proportional to the thickness of the layer, there may be practical reasons for a junction near the front of the silicon. The practical decision of the best location of the p-n junction will require a consideration of both efficiency and difficulty of processing.

The present invention benefits from lattice matching. U.S. Pat. No. 6,300,558 ('558) discloses a lattice matched solar cell. As noted therein, the tandem solar cell has also been known in which the indium gallium phosphide (InGaP) solar cell which is supposed to be lattice-matched with GaAs and has the wider band gap Eg than GaAs is further stacked on the GaAs/Ge heteroepitaxial solar cell. Each of the GaAs/Ge heteroepitaxial solar cell and the GaAs/Ge-GaAs/InGaP tandem solar cell is heteroepitaxially grown by the method such as the metalorganic chemical vapor deposition (MOCVD) method.

However, this (InGaP) solar cell of the '558 patent is lattice matched to GaAs or Germanium, and the thickness and bandgap of the (InGaP) are well matched for energy conversion in tandem with a gallium arsenide substrate cell. Because of the lattice mismatch, it is difficult (or impossible) to grow material of this composition or bandgap on a silicon substrate.

Materials

EXAMPLE 1

In this example, the p-n junction is disposed close to the GaP.
- for the substrate layer 101, a thickness of 250 micrometers, doping level p-type, 1 times ten to the fifteenth ($1\times10^{15}$, or 1E15) boron atoms per cubic centimeter.
- for the overlying layer 102, a thickness of 0.1 micrometer, doping level n-type, 1E17 phosphorous atoms per cubic centimeter.
- for the tunnel junction layer 103, silicon, thickness 0.05 micrometer, doping level n-type, 1E20 phosphorous atoms per cubic centimeter.
- for the tunnel junction layer 104, silicon, thickness 0.05 micrometer, doping level p-type, 2E20 boron atoms per cubic centimeter.
- for the GaP layer 105, thickness 20 micrometers, doping level p-type, 1E15 zinc atoms per cubic centimeter.
- for the GaP layer 106, thickness 1 micrometer, doping level n-type, 1E18 sulfur atoms per cubic centimeter.
- for the top metal contact 107, gold-zinc alloy (98% gold, 2% zinc)
- for the back metal contact 108, aluminum, thickness 30 micrometers.

For depositing the epitaxial layers, MOCVD gives good crystal quality. Liquid-phase epitaxy (LPE) is also a good choice, since it seems to work well on GaP.

EXAMPLE 2

In this example, the p-n junction is disposed back from the GaP.
- for the substrate layer 101, a thickness of 10 micrometers, doping type p-type, doping 1 times ten to the seventeenth (1E17) boron atoms per cubic centimeter.
- for the overlying layer 102, thickness 250 micrometers, doping type n-type, doping 1E15 phosphorus atoms per cubic centimeter.
- for the tunnel junction n-layer 103, silicon, thickness 0.05 micrometer, doping 1E20 phosphorus atoms per cubic centimeter.
- for the tunnel junction p-layer 104, silicon, thickness 0.05 micrometer, doping 2E20 boron atoms per cubic centimeter.
- for the GaP p-layer 105, thickness 20 micrometer, doping p-type 1E15 zinc atoms per cubic centimeter.
- for the GaP n-layer 106, thickness 1 micrometer, doping n-type 1E18 sulfur atoms per cubic centimeter.
- for the front contact metal 107, composition gold-zinc alloy (98% gold/2% zinc).
- for the rear contact metal 108, composition aluminum, thickness 30 micrometers.

In the solar cell designs discussed herein, window layers may optionally be included. For example, the top gallium phosphide layer may include a window layer on the front surface. Possible window layer materials for GaP include aluminum phosphide, aluminum-gallium phosphide in which aluminum is substituted for a portion of the gallium in the composition, or more complicated formulations such as the quaternary III–V compounds gallium-indium nitride phosphide or gallium-indium arsenide nitride. Such window layers may be disposed between the front surface of the semiconductor and the metal contacts, or in some implementations, they are disposed on the front surface of the semiconductor, and the window material is etched away in the places where the metal contact is placed. The use of window layers on solar cells produced from semiconductors of the III–V family is well known.

Operation

FIG. 2 is a graph of current (I) as a function of voltage (V) for a typical GaP solar cell, as well as the I vs V graph for a typical silicon solar cell. Current (I) is on the vertical axis. Voltage (V) is on the horizontal axis. The graph also shows current (I) as a function of voltage (V) for the two-layer, tandem, GaP-on-Silicon solar cell 100 shown in FIG. 1.

A first curve 202 represents the I–V curve for the individual silicon (Si) solar cell element (101, 102). A point 203 on the first curve 202 represents the maximum power point of the silicon solar cell element (101, 102).

A second curve 204 represents the I–V curve for the GaP solar cell element (105, 106). A point 205 on the second curve 204 represents the maximum power point of the GaP solar cell element (105, 106).

In each of the curves shown in the graph, the current at the point where voltage is zero is known as the "short-circuit current" (Isc), and the voltage at the point where current is zero is known as the "open-circuit voltage" (Voc). As is evident, the silicon solar cell element has far higher short circuit current, but much lower open circuit voltage, than the gallium phosphide solar cell element.

A third curve 206 represents the I–V curve for the two-layer, tandem, GaP-on-Silicon solar cell (100) shown in FIG. 1. A point 207 on the third curve 206 represents the maximum power point of the two-layer, tandem, GaP-on-Silicon solar cell (100).

In this figure, it can be observed that the silicon solar cell element (202) is capable of producing more current than the GaP solar cell element (204) and, when combined (206), the overall voltage is essentially additive.

When a silicon solar cell is put together with a gallium-phosphide solar cell to form a two-junction solar cell (as disclosed herein), the constraint is that the same current must (by definition) flow through both cells, and the voltages of the two layers add together. Thus, on any horizontal line (line of constant current) in this graph, the current vs. voltage plot for the combined cell, consisting of the two elements in series, can be calculated by adding the voltage of the two elements.

The result, as shown, is that the high current of the silicon cell (curve 202) cannot be completely used, because the current of the total combination (curve 206) is limited by the lower current capability of the GaP cell (curve 204). While this mismatch in current is undesirable for optimum performance near room temperature, the performance at elevated temperatures makes this combination attractive, for a solar cell which must operate at elevated temperatures, or over a wide range of temperatures. At elevated temperatures, the solar cell 100 will function as if it were a single-junction gallium phosphide semiconductor device, which is clearly preferable to the poor performance of a silicon solar cell which, as discussed above, loses about 0.45% of its initial power for each degree of increase in operating temperature and, above about 250 C, produces essentially zero power.

On the Use of GaP in PV Cells

Although crystalline silicon (Si) is a desirable substrate material, silicon is not normally used for the substrate of multiple junction solar cells because the crystalline lattice constant does not match the lattice constant of common semiconductors with the correct bandgap for the top (high bandgap) layers of such a cell.

The best materials for passivation would have the same crystal structure and lattice constant as silicon. Among the III–V semiconductors, the best match to silicon is GaP. One semiconductor, gallium phosphide (GaP) does nearly match the lattice constant of silicon. GaP epitaxial growth on Si wafers has been demonstrated, as a candidate lattice-matched, wide-bandgap material intended to replace $SiO_2$ passivation on silicon solar cells. See C. Case, G. Landis, R. Beaulieu, et al., "Wide-Bandgap Passivation Layers on Silicon," *Proc. 19th IEEE Photovoltaic Specialists Conference*, New Orleans, La.; pp. 391–404 (1987). This article discusses growing GaP films in an MOCVD reactor, and depositing GaP onto completely fabricated solar cells, by sputtering. The article also discusses that GaP can be made highly conducting so that it should be possible to deposit ohmic contacts directly over the wide bandgap layer, and thus cover the entire surface with a passivating layer.

However, the 2.26 eV bandgap of GaP is too high to function efficiently as a top layer of a two-junction solar cell with silicon as the lower layer. As discussed above, with respect to FIG. 2, The result of the photocurrent mismatch is that the silicon cell produces higher photocurrent than can be usefully carried by the GaP layer, and thus the GaP layer limits the solar cell current produced by the silicon layer to less than half of the current that the layer would be capable of producing. Hence, the performance added by the addition of the GaP layer is comparable to the loss to the silicon cell performance caused by the GaP junction, and there is little or no net gain in adding a GaP layer. In the state of the art, multiple junction solar cells avoid such a large disparity in the photocurrent because of this performance loss. However, as will be shown, the particular combination of GaP and silicon has advantages in extended temperature operation.

Although a GaP-on-silicon two-junction solar cell has unexceptional performance at standard temperatures near 25 C, the GaP semiconductor material has a wide bandgap of 2.26 eV, and hence, the GaP element has a very low power loss at elevated temperatures. The silicon layer, on the other hand, has a high power loss at increased temperature. Thus for a GaP-on-silicon two-junction solar cell operating at high temperature (above about 250 C), essentially zero power will be produced by the silicon layer, and all of the power will be produced by the GaP layer which performs well at high temperature.

It is thus seen that the first embodiment of the invention describes a solar cell 100 with an extended temperature range, comprising a two-junction cell with a silicon (Si) bottom junction and a gallium phosphide (GaP) top junction. At low temperatures, the solar cell will operate as a two-junction solar cell, with the photocurrent of the bottom junction limited by the gallium phosphide. At elevated temperatures, the cell will function as if it were a single-junction gallium phosphide semiconductor device.

It is within the scope of this invention that slight compositional variations from the composition GaP can be made to produce a material with slightly altered lattice constant. The compositional variation is done by substituting a small amount of another group III element (boron, aluminum, indium, or thallium) for the gallium, and/or a small amount of another group V element (nitrogen, arsenic, antimony, or bismuth) for the phosphorus in the compound. Altering the composition can allow the lattice constant to be fine-tuned in order to optimize the best growth conditions. For the purposes of this disclosure, the composition will be considered to be substantially gallium phosphide if the amount of compositional variation is less than ten percent (10%). ("Ten percent" as understood here refers to ten percent by atomic composition.). As used herein, "small" amount means no more than 10% substitution of a different group III atom for the gallium, and no more than 10% substitution of a different group V element for the phosphorous.

ALTERNATE EMBODIMENT

It is evident from FIG. 2 that the Si solar cell element is operating inefficiently, since the current produced above the short-circuit current of the GaP solar cell element is wasted.

According to an alternate embodiment of the invention, a technique is provided to use the silicon solar cell element more efficiently.

FIG. 3 illustrates an improved multijunction solar cell structure 300 comprising three solar cell junctions and two tunnel junctions, and is shown exploded, for illustrative clarity.

Generally, the difference between the solar cell structure 300 and the solar cell structure 100 is that the solar cell structure 300 comprises a single-layer wide-bandgap solar cell junction electrically connected in series on top of two series-connected lower junctions of substantially the same bandgap as one another, designed in such a way that the uppermost of the two lower junctions has enough transparency to let light through to the bottom junction. The specific embodiment here is that the top solar cell junction is GaP, and the bottom solar cell junction consists of two silicon p-n junctions connected in series with a tunnel junction, such that the top junction layer is thin enough that approximately half of the light reaching it is transmitted through to the next lower layer. Stated another way, the bandgap of the material of the top wide-bandgap solar cell junction is chosen such that the top material absorbs no more than ⅓ of the incident photons of the illumination.

In a conventional tandem cell comprising semiconductors of two bandgaps operating in electrical series, two junctions are used, and the materials and thicknesses are selected so that approximately half of the photons are absorbed in the wider bandgap top material and in the lower bandgap bottom material, resulting in equal photogenerated current in both materials. If the materials are not chosen so that the photogenerated current is approxmately equal, the output is limited by the lower of the two currents. This constraint limits the materials which can be used. By replacing the single p-n junction in the lower bandgap material with two p-n junctions, of the same material, operating in tandem, this constraint is changed. In this case, the optimum efficiency is achieved when the top wide bandgap material absorbs approximately one third of the photons, to result in photocurrents that are equally matched among all three p-n junctions. This constraint allows a much wider bandgap material to be used for the top layer, or correspondingly, a lower bandgap material to be used for the bottom layer.

Likewise, when the low bandgap material comprises three p-n junctions operating in tandem, the optimum is achieved when the top material absorbs approximately one quarter of the photons. Again, the revised constraint allows a new choice of materials.

The solar cell 300 is comparable to the solar cell 100 in that it comprises:

- a first, bottom solar cell junction comprising a substrate layer/wafer 301 (compare 101) of crystalline silicon of a first semiconductor conductivity type (either p-type or n-type), and a layer 302 (compare 102) of silicon of second semiconductor conductivity type (either n-type or p-type), opposite to the first semiconductor conductivity type,
- a second, top solar cell junction comprising a layer 305 (compare 105) of gallium phosphide of the first conductivity type, and a surface layer 306 (compare 106) of gallium phosphide of the second conductivity type,
- at least one top metal contact 307 (compare 107) disposed atop, and electrically connected to, the top GaP layer 307, and at least one bottom (back) metal contact 308 (compare 108) disposed beneath, and electrically connected to, the bottom silicon layer 301. A window layer (not shown) may be disposed atop the GaP layer 306. The solar cell is illuminated from the top/front side.

The solar cell 300 is different than the solar cell 100 in that it further comprises:

- a third solar cell junction, comprising a layer 311 (compare 301) of silicon of a first semiconductor conductivity type (either p-type or n-type), and a layer 312 (compare 302) of silicon of second semiconductor conductivity type (either n-type or p-type), opposite to the first semiconductor conductivity type, and
- the third solar cell junction is disposed between the bottom solar cell junction 301/302 and the top solar cell junction 305/306.

The solar cell 300 further comprises:

- a first tunnel-junction comprising two layers 303 and 304 (compare 103 and 104) disposed beneath the top solar cell junction 304/305 and the next lower solar cell juntion (in this case, the third solar cell junction 311/312), connecting these two solar cell junctions in series with one another, and
- a second tunnel junction comprising two layers 309 and 310 (compare 303 and 304) disposed beneath the third solar cell junction 311/312 and the next lower solar cell juntion (in this case, the first solar cell junction 301/302), connecting these two solar cell junctions in series with one another.

The thickness of the silicon layer (311 and 312) is so chosen that the short-circuit current of each of the silicon junctions is greater than or equal to that of the GaP.

ALTERNATE EMBODIMENT

An alternate embodiment uses more than two bottom layers, and most preferably three layers The thickness of the layers is chosen so that, including the effect of the GaP solar cell in filtering light reaching the silicon, the short-circuit current is substantially the same for all three layers.

ANOTHER ALTERNATE EMBODIMENT

While the detailed invention here shows GaP on silicon, the technique of using two or more bottom junctions of substantially the same bandgap can be used to construct multi-junction solar cells of many types, by relaxing the constraint that the short-circuit currents must match.

There has thus been described an exemplary two junction solar cell 100 comprising a top GaP junction and a bottom Si junction, and an exemplary three junction solar cell 300 comprising a top GaP junction and a bottom two-junction Si cell.

The invention has been illustrated and described in a manner that should be considered as exemplary rather than restrictive in character—it being understood that only preferred embodiments have been shown and described, and that all changes and modifications that come within the spirit of the invention are desired to be protected. Undoubtedly, many other "variations" on the techniques set forth hereinabove will occur to one having ordinary skill in the art to which the present invention most nearly pertains, and such variations are intended to be within the scope of the invention, as disclosed herein.

For example, several additional features which may be present to increase efficiency include an antireflective coating of a transparent dielectric material on the sun-facing surface, or a "window-layer" or heteroface of a wide-bandgap semiconductor material on the sun-facing surface. For gallium phosphide, one window layer material is aluminide phosphide or the ternary material aluminum-gallium phosphide. If both a window layer and an antireflective coating are present, the window layer is in direct contact with the semiconductor, and the antireflective coating is on the surface of the window layer. The use of window-layer and antireflective coating features are well-known in the art.

For example, while the p-n junctions shown and described above are homojunctions (that is, both the p and n layers are of the same material), it is also possible for a heterojunction to be used in the lower bandgap material. For example, in FIG. 1, layer 101 could be silicon, and layers 102, 103, 104, 105, and 106 gallium phosphide. In this case, the p-n junction between layers 101 and 102 is a p-n heterojunction. The light absorption characteristic of the bottom subcell is still that haracteristic of silicon, and the generated characters are now collected across a p-n heterojunction.

What is claimed is:

1. A solar cell, comprising:
   a first solar cell junction comprising silicon (Si); and
   a second solar cell junction deposited on the first solar cell junction, second solar cell junction comprising a compound semiconductor based on gallium phosphide (GaP) with no more than ten percent of one of the group-III elements (boron, aluminum, indium, or thallium) substituted for the gallium and no more than ten percent of one of the group-V elements (nitrogen, arsenic, antimony, or bismuth) substituted for the phosphorus, and including a single photovoltaic p-n junction.

2. Solar cell, according to claim 1, further comprising:
   a tunnel junction disposed between the first solar cell junction and the second solar cell junction.

3. Solar cell, according to claim 1, wherein the first solar cell junction comprises:
   a substrate of crystalline silicon of a first semiconductor conductivity type;
   a layer of silicon of a second semiconductor conductivity type;
   an interface between the two conductivity types comprising a p-n semiconductor junction.

4. Solar cell, according to claim 1, wherein:
   the first solar cell junction is connected in series with the second solar cell junction.

5. Solar cell, according to claim 1, wherein:
the first solar cell junction comprises two layers having opposite conductivity types, and
the second solar cell junction comprises two layers having opposite conductivity types.

6. Solar cell, according to claim 5, wherein:
the orientation of the first and second solar cell junctions are the same.

7. Solar cell, according to claim 1, further comprising:
at least one top metal contact disposed atop, and electrically connected to, the second solar cell junction; and
at least one bottom metal contact disposed beneath, and electrically connected to, the first solar cell junction.

8. Solar cell, according to claim 1, wherein:
the solar cell is manufactured in a p-on-n configuration.

9. Solar cell, according to claim 1, wherein:
the solar cell is manufactured in a n-on-p configuration.

10. Solar cell, according to claim 1, wherein:
the first solar cell junction comprises a silicon wafer and a p-n junction in the silicon wafer.

11. Solar cell, according to claim 10, wherein:
the p-n junction is disposed close to the top of the wafer, near the second solar cell junction.

12. Solar cell, according to claim 10, wherein:
the p-n junction is disposed close to the back of the wafer.

13. A solar cell, comprising:
a first solar cell junction comprising silicon (Si); and
a second solar cell junction comprising a compound semiconductor based on gallium phosphide (GaP) with no more than ten percent of one of the group-III elements (boron, aluminum, indium, or thallium) substituted for the gallium and no more than ten percent one of the group V elements (nitrogen, arsenic, antimony, or bismuth) substituted for the phosphorus; and
a third solar cell junction comprising silicon disposed between the first and second solar cell junctions.

14. Solar cell, according to claim 13, further comprising:
a first tunnel junction disposed between the first solar cell junction and the third solar cell junction; and
a second tunnel junction disposed between the third solar cell junction and the second solar cell junction.

15. Solar cell, according to claim 13, wherein the first solar cell junction comprises:
a substrate of crystalline silicon of a first semiconductor conductivity type; and
a layer of silicon of a second semiconductor conductivity type.

16. Solar cell, according to claim 13, wherein:
the third solar cell junction is connected in series with the first and second solar cell junctions.

17. Solar cell, according to claim 13, wherein the second solar cell junction comprises:
a first layer of gallium phosphide (GaP) of the first conductivity type; and
a second layer of gallium phosphide (GaP) of the second conductivity type.

18. Solar cell, according to claim 13, wherein the third solar cell junction comprises:
a first layer of silicon of the first conductivity type; and
a second layer of silicon of the second conductivity type.

19. Solar cell, according to claim 13, wherein:
the first solar cell junction comprises two layers having opposite conductivity types;
the second solar cell junction comprises two layers having opposite conductivity types; and
the third solar cell junction comprises two layers having opposite conductivity types.

20. Solar cell, according to claim 19, wherein:
the orientation of the first, second and third solar cell junctions are the same.

21. Solar cell, according to claim 13, further comprising:
a first tunnel-junction disposed between the first solar cell junction and the third solar cell junction.

22. Solar cell, according to claim 13, further comprising:
at least one top metal contact disposed atop, and electrically connected to, the second solar cell junction; and
at least one bottom metal contact disposed beneath, and electrically connected to, the first solar cell junction.

23. Solar cell, according to claim 13, wherein:
the solar cell is manufactured in a p-on-n configuration.

24. Solar cell, according to claim 13, wherein:
the solar cell is manufactured in a n-on-p configuration.

25. Solar cell, according to claim 13, wherein:
the first solar cell junction comprises a silicon wafer and a p-n junction in the silicon wafer.

26. Solar cell, according to claim 25, wherein:
the p-n junction is disposed close to the top of the silicon wafer, near the third solar cell junction.

27. Solar cell, according to claim 25, wherein:
the p-n junction is disposed close to the back of the silicon wafer.

28. A solar cell comprising:
a top layer composed of GaP, incorporating a p-n semiconductor junction, and three bottom layers composed of silicon, each incorporating a p-n junction.

29. Solar cell, according to claim 28, wherein:
the thicknesses of the three bottom silicon layers is are chosen so that the short-circuit current is substantially the same for all of the bottom layers.

30. A multi-junction solar cell comprising:
three or more solar cell junctions, one of which is a top junction, two or more of which are bottom junctions, wherein material comprising the two or more bottom junctions is silicon, and the material comprising the top junction is GaP with no more than ten percent of one of the group-III elements (boron, aluminum, indium, or thallium) substituted for the gallium and no more than ten percent of one of the group-V elements (nitrogen, arsenic, antimony, or bismuth) substituted for the phosphorus.

31. A solar cell comprising:
a top subcell, a middle subcell, and a bottom subcell, said subcells being connected in an electrical series connection with one another, with said top subcell comprising a wide-bandgap semiconductor GaP with no more than ten percent of one of the group-III elements (boron, aluminum, indium, or thallium) substituted for the gallium and no more than ten percent of one of the group-V elements (nitrogen, arsenic, antimony, or bismuth) substituted for the phosphorus and incorporating a p-n junction, and said middle subcell and said bottom subcell each comprising crystalline silicon and incorporating p-n junctions, and the bandgap of the crystalline silicon comprising the middle subcell having substantially the same as the bandgap of the crystalline silicon comprising said bottom subcell.

32. Solar cell, according to claim 31, wherein:
each said subcell is electrically connected to the adjacent subcell by a tunnel junction.

33. A solar cell comprising:
a substrate comprising a single-crystal silicon wafer and a first p-n junction;
a layer of gallium phosphide disposed on top of the silicon wafer with no more than ten percent of one of the group-III elements (boron, aluminum, indium, or thallium) substituted for the gallium and no more than ten percent of one of the group-V elements (nitrogen, arsenic, antimony, or bismuth) substituted for the phosphorus, the layer of gallium phosphide comprising a second p-n junction which is oriented in the same direction as the first p-n junction;

a tunnel junction disposed between the silicon wafer and the gallium phosphide layer, forming an electrical series connection between the silicon wafer and the gallium-phosphide layer;

a first metal contact layer on the bottom side of the silicon wafer, forming an electrical contact; and a second metal contact layer disposed on top of the gallium phosphide layer, the second metal contact layer comprising a gridded contact to allow illumination to reach the gallium phosphide layer.

34. A solar cell comprising:

a substrate comprising a single-crystal silicon wafer, and containing layers defining a first p-n n junction, a first tunnel junction disposed on top of the first p-n junction, and a second p-n junction which is oriented in the same direction as said first p-n junction;

a layer of gallium phosphide disposed on top of the silicon wafer with no more than ten percent of one of the group-III elements (boron, aluminum, indium, or thallium) substituted for the gallium and no more than ten percent of one of the group-V elements (nitrogen, arsenic, antimony, or bismuth) substituted for the phosphorus, the layer of gallium phosphide comprising a third p-n junction which is oriented in the same direction as the first and second p-n junctions, a second tunnel junction between the silicon wafer and the gallium phosphide layer, forming an electrical series connection between the silicon wafer and the gallium-phosphide layer;

a first metal contact layer on the bottom side of the silicon wafer, forming an electrical contact; and a second metal contact layer disposed on top of the gallium phosphide layer, said second metal contact comprising a gridded contact to allow illumination to reach the gallium phosphide layer.

* * * * *

UNITED STATES PATENT AND TRADEMARK OFFICE
CERTIFICATE OF CORRECTION

PATENT NO.       : 7,148,417 B1                                    Page 1 of 1
APPLICATION NO. : 10/403714
DATED            : December 12, 2006
INVENTOR(S)      : Geoffrey A. Landis It is certified that error appears in the above-identified patent and that said Letters Patent is hereby corrected as shown below:

Column 16, line 30 delete the word "is"
Column 17, line 36 delete the "n" that comes after "p-n" and before "junction"

Signed and Sealed this

Thirtieth Day of January, 2007

JON W. DUDAS
*Director of the United States Patent and Trademark Office*